(12) United States Patent
Nakashita

(10) Patent No.: US 9,243,812 B2
(45) Date of Patent: Jan. 26, 2016

(54) FLOW PATH STRUCTURE AND ELECTRONIC APPARATUS

(75) Inventor: Daisuke Nakashita, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 961 days.

(21) Appl. No.: 13/396,719

(22) Filed: Feb. 15, 2012

(65) Prior Publication Data

US 2012/0206878 A1 Aug. 16, 2012

(30) Foreign Application Priority Data

Feb. 16, 2011 (JP) .................................. 2011-030431

(51) Int. Cl.
| | |
|---|---|
| F15D 1/04 | (2006.01) |
| F24F 13/02 | (2006.01) |
| F24F 13/08 | (2006.01) |
| H05K 7/20 | (2006.01) |

(52) U.S. Cl.
CPC . *F24F 13/02* (2013.01); *F15D 1/04* (2013.01); *F24F 13/081* (2013.01); *H05K 7/20172* (2013.01)

(58) Field of Classification Search
CPC ... F04D 29/541; F04D 29/542; F04D 29/544; F04D 29/545; F04D 29/547; H05K 7/20145; H05K 7/20172; F24F 13/02; F24F 13/081; F15D 1/04
USPC ........................ 415/914, 183–185, 208.1, 220
See application file for complete search history.

(56) References Cited

U.S. PATENT DOCUMENTS

| | | | | | |
|---|---|---|---|---|---|
| 2,662,553 | A | * | 12/1953 | Dimmock ........................ | 138/37 |
| 2,884,956 | A | * | 5/1959 | Perlin .............................. | 138/39 |
| 4,919,170 | A | * | 4/1990 | Kallinich et al. ............... | 138/39 |
| 5,431,009 | A | * | 7/1995 | Bauver, II .................. | 60/39.182 |
| 5,531,484 | A | * | 7/1996 | Kawano ..................... | 285/179.2 |

(Continued)

FOREIGN PATENT DOCUMENTS

| | | |
|---|---|---|
| CN | 1112995 A | 12/1995 |
| CN | 1580943 A | 2/2005 |

(Continued)

OTHER PUBLICATIONS

Extended European Search Report for corresponding EP 12000887.5, mail date Apr. 15, 2014.

(Continued)

*Primary Examiner* — Edward Look
*Assistant Examiner* — Danielle M Christensen
(74) *Attorney, Agent, or Firm* — Rossi, Kimms & McDowell LLP

(57) ABSTRACT

The flow path structure includes a flow path introducing fluid from an inlet to an outlet, and a flow velocity control structure provided in a portion between the inlet and the outlet in the flow path to reduce difference in flow velocity that the fluid flowing into the flow path has in a direction intersecting with a flow direction of the fluid. The flow velocity control structure includes, in the direction intersecting with the flow direction, plural flow velocity control members provided alternately with spaces through which the fluid passes. The flow velocity control members have different sizes from each other, the sizes increasing as the flow velocity of the fluid at areas, in the direction intersecting with the flow direction, where the respective flow velocity control members are provided increases.

8 Claims, 13 Drawing Sheets

(56) References Cited

U.S. PATENT DOCUMENTS

| | | | |
|---|---|---|---|
| 6,290,266 B1 * | 9/2001 | Kawano | 285/125.1 |
| 8,087,491 B2 * | 1/2012 | Merchant et al. | 181/224 |
| 2010/0154911 A1 | 6/2010 | Yoskowitz | |
| 2012/0206878 A1 * | 8/2012 | Nakashita | 361/689 |

FOREIGN PATENT DOCUMENTS

| | | | | |
|---|---|---|---|---|
| CN | 1884854 A | 12/2006 | | |
| CN | 201272741 Y | 7/2009 | | |
| DE | EP0146954 A2 * | 7/1985 | | F24F 13/068 |
| EP | 0 940 585 A1 | 9/1999 | | |
| FR | 987477 A | 8/1951 | | |
| JP | 64025599 A | 1/1989 | | |
| JP | 03188798 A | 8/1991 | | |
| JP | 07-269524 A | 10/1995 | | |
| JP | 2706222 B2 | 1/1998 | | |
| JP | 2002-349944 A | 12/2002 | | |
| JP | 2003-194018 A | 7/2003 | | |
| JP | 2004-151648 A | 5/2004 | | |
| JP | 2005-098657 A | 4/2005 | | |
| WO | 2005/079950 A1 | 9/2005 | | |

OTHER PUBLICATIONS

Japanese Office Action cited in Japanese counterpart application No. JP2011030431, dated Sep. 16, 2014.

Notification of the First Office Action for corresponding CN 201210031295.X, mail date Jan. 27, 2014. English translation provided.

* cited by examiner

FLOW PATH STRUCTURE AND ELECTRONIC APPARATUS

BACKGROUND OF THE INVENTION

1. Field of the Invention

The present invention relates to a flow path structure to guide fluid such as gas and liquid in various electronic apparatuses.

2. Description of the Related Art

Flow paths such as ducts and conduit pipes that guide fluid such as gas and liquid in a chassis of an electron apparatus are needed to be disposed around various elements in the chassis, so that the flow paths often include a bent portion (curved portion) or a portion whose sectional area is changed in a flow direction of the fluid. Such portions generate, in a direction (or in a plane) orthogonal to the flow direction, difference in flow velocity of the fluid flowing in the flow path. In other words, such portions generate a distribution of the flow velocity.

For example, in a case of providing a fan on a downstream side in a duct inside which air flows, a flow velocity distribution of the air flowing into the fan significantly deteriorates performance of the fan. Moreover, flow of fluid with a flow velocity distribution into a bent portion of the flow path generates flow separation, which decreases utilization efficiency of the flow path. Therefore, acquisition of a high utilization efficiency requires a flow path structure allowing flow of fluid with a uniform flow velocity.

Such a flow path structure is desirable to be employed for, for example, an image projection apparatus such as a liquid crystal projector requiring a miniaturized and low noise configuration while using air convection produced by driving a fan to cool heat generating elements provided inside the projector.

Japanese Patent Laid-Open No. 2002-349944 discloses a flow path structure that rectifies inflow air by a porous plate and a honeycomb plate that are provided at an inlet of a duct including a bent portion, and then introduces the rectified air to an outlet located on a more downstream side than the bent portion through distribution plates provided in the bent portion. This flow path structure further rectifies outflow air by another porous plate and another honeycomb plate that are provided at the outlet.

Moreover, Japanese Patent Laid-Open No. 2005-098657 discloses a flow path structure that provides a flow control filter inside a duct into which air with a flow velocity distribution flows, and that reduces difference in flow velocity by setting a high airflow resistance of the flow control filter for a high flow velocity area and a low airflow resistance thereof for a low flow velocity area. This flow path structure uses a pleated filter as the flow control filter, and increases and decreases the airflow resistance by changing a pleats pitch of the filter.

In addition, Japanese Patent No. 2706222 discloses a flow path structure that provides guide blades formed so as to have mutually similar shapes at a bent portion of a duct. The guide blades allow fluid flowing into the bent portion with a uniform flow velocity to maintain the uniform flow velocity also on a more downstream side than the bent portion.

However, the flow path structure disclosed in Japanese Patent Laid-Open No. 2002-349944 provides the porous plate and the honeycomb plate, which are members significantly increasing flow path resistance, before and behind the bent portion (in other words, at the inlet and the outlet). Therefore, the structure requires increase of power of the fan in order to ensure a predetermined flow rate of the air flowing through the duct, which may increase noise.

Moreover, the flow path structure disclosed in Japanese Patent Laid-Open No. 2005-098657 covers an entire cross section of the flow path orthogonal to a flow direction of the air with the flow control filter, which significantly increases flow path resistance, as with the flow path structure disclosed in Japanese Patent Laid-Open No. 2002-349944, thereby resulting in increase of required power of the fan and noise.

Furthermore, the flow path structure disclosed in Japanese Patent No. 2706222 cannot uniformize the flow velocity of the fluid flowing out from the bent portion if the flow velocity of the fluid flowing in the bent portion is not uniform, that is, if the fluid flowing in the bent portion has flow velocity difference (flow velocity distribution).

SUMMARY OF THE INVENTION

The present invention provides a flow path structure capable of uniformizing flow velocity of fluid flowing therein with flow velocity difference in a direction intersecting with a flow direction of the fluid, without significantly increasing flow path resistance.

The present invention provides as one aspect thereof a flow path structure including a flow path introducing fluid from an inlet to an outlet, and a flow velocity control structure provided in a portion between the inlet and the outlet in the flow path to reduce difference in flow velocity that the fluid flowing into the flow path has in a direction intersecting with a flow direction of the fluid. The flow velocity control structure includes, in the direction intersecting with the flow direction, plural flow velocity control members provided alternately with spaces through which the fluid passes. The flow velocity control members have different sizes from each other. The sizes increase as the flow velocity of the fluid at areas, in the direction intersecting with the flow direction, where the flow velocity control members are provided increases.

The present invention provides as another aspect thereof an electronic apparatus provided with the above fluid flow path structure.

Further features of the present invention will become apparent from the following description of exemplary embodiments with reference to the attached drawings.

DESCRIPTION OF THE PREFERRED EMBODIMENTS

Exemplary embodiments of the present invention will be described below with reference to the accompanied drawings.

Embodiment 1

Figure 1:
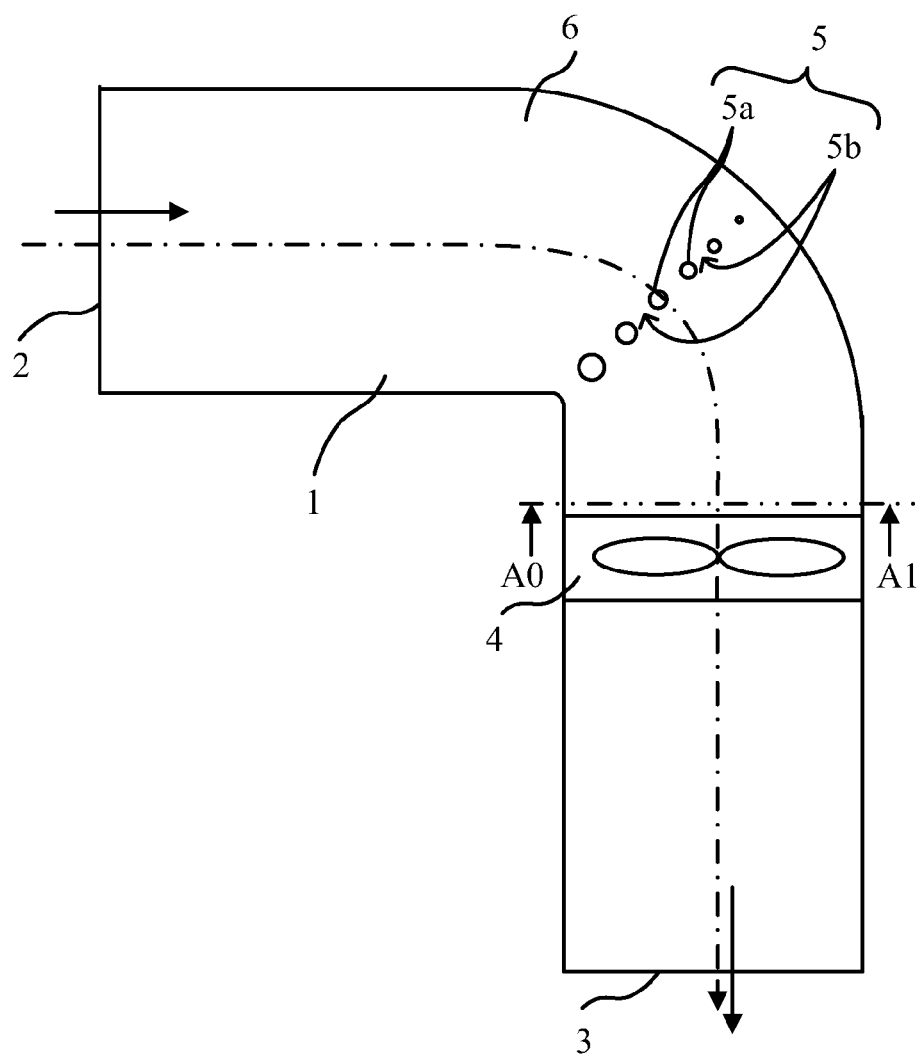
FIG. 1 is a cross-sectional view of a duct unit that is Embodiment 1 of the present invention along an airflow direction.

FIG. 1 shows a cross section of a duct unit as a flow path structure that is a first embodiment (Embodiment 1) of the present invention. Reference numeral 1 denotes a duct that forms a flow path in the duct unit. Reference numeral 2 denotes an inlet of the duct 1. Reference numeral 3 denotes an outlet of the duct 1. Reference numeral 6 denotes a portion bent (curved) with an angle of 90 degrees and formed between the inlet 2 and the outlet 3 in the duct 1. The portion 6 is hereinafter referred to as "a bent portion" (or "a curved portion").

The duct 1 (duct unit) introduces air (shown by a solid arrow in FIG. 1), which is fluid and flows into the duct 1 from the inlet 2, to the outlet 3 with bending of a flow direction of the air (shown by a dashed arrow in FIG. 1 and hereinafter referred to as "an airflow direction") by 90 degrees in the bent portion 6.

Reference numeral 4 denotes a fan provided between the bent portion 6 and the outlet 3 in the duct 1 (that is, in the flow path). This embodiment uses an axial fan as the fan 4.

Reference numeral 5 denotes a flow velocity control structure provided in the bent portion 6, that is, in a portion in the airflow direction between the inlet 2 and the outlet 3 in the duct 1. The flow velocity control structure includes, in a direction intersecting with the airflow direction, plural flow velocity control members 5a that are provided alternately with spaces 5b through which the air passes. The direction intersecting with the airflow direction includes not only a direction intersecting with the airflow direction at 90 degrees, that is, a direction orthogonal to the airflow direction, but also directions intersecting with the airflow direction at angles other than 90 degrees. The direction intersecting with the airflow direction is hereinafter referred to as "an intersectional-to-flow direction".

Although this embodiment provides the flow velocity control structure 5 in the bent portion 6, the flow velocity control structure 5 may be provided in any portion (position) between the inlet 2 and the fan 4 as long as the flow velocity control structure 5 can reduce difference in flow velocity (hereinafter referred to as "flow velocity difference") of the air flowing into the fan 4. In other words, the fan 4 is desirable to be provided at any position between the flow velocity control structure 5 and the outlet 3.

The flow velocity control structure 5 has a configuration to reduce the flow velocity difference that the air flowing into the inlet 2 has in the intersectional-to-flow direction. Specifically, sizes of the flow velocity control members 5a are different from each other so as to increase as the flow velocity of the air at areas in the intersectional-to-flow direction where the respective flow velocity control members are provided increases. A method to decide the sizes of the flow velocity control members 5a will be described later.

In such a duct unit, rotation of the fan 4 supplied with electric power from a power source (not shown) causes the air to flow into the duct 1 from the inlet 2. The air flowing into the duct 1 flows toward the flow velocity control structure 5. The air flowing in the inlet 2, as mentioned above, has the flow velocity difference (flow velocity distribution) in the intersectional-to-flow direction.

The velocity of the air reaching the flow velocity control structure 5 is uniformized (that is, the flow velocity difference is reduced) by the flow velocity control structure 5, and then flows toward the fan 4. The air flowing through the fan 4 flows out from the duct 1 through the outlet 3 to be used for, for example, cooling heat generating elements.

Next, a more detailed description of the flow velocity control structure 5 will be made. Firstly, description will be made of airflow in a duct unit as a comparative example that is not provided with the flow velocity control structure 5 described in Embodiment 1, with reference to FIGS. 7 to 10.

Figure 7:
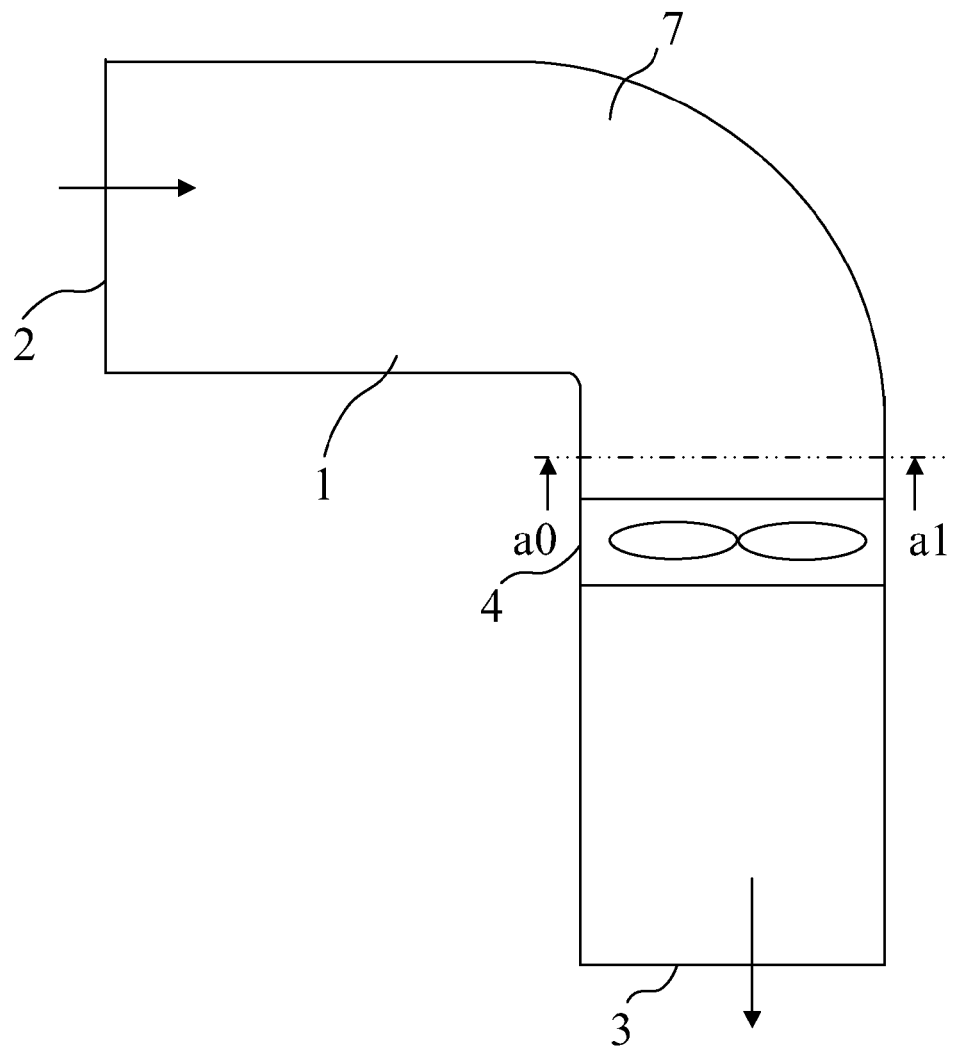
FIG. 7 is a top view of the duct unit not including the flow velocity control structure described in Embodiment 1.

In FIG. 7, reference numeral 7 denotes a bent portion that is a portion of the duct 1 and where the flow velocity control structure 5 is not provided. Other components of the duct unit of this comparative example are identical to those of the duct unit shown in FIG. 1, and therefore denoted by the same reference numerals as those in FIG. 1.

Figure 8:
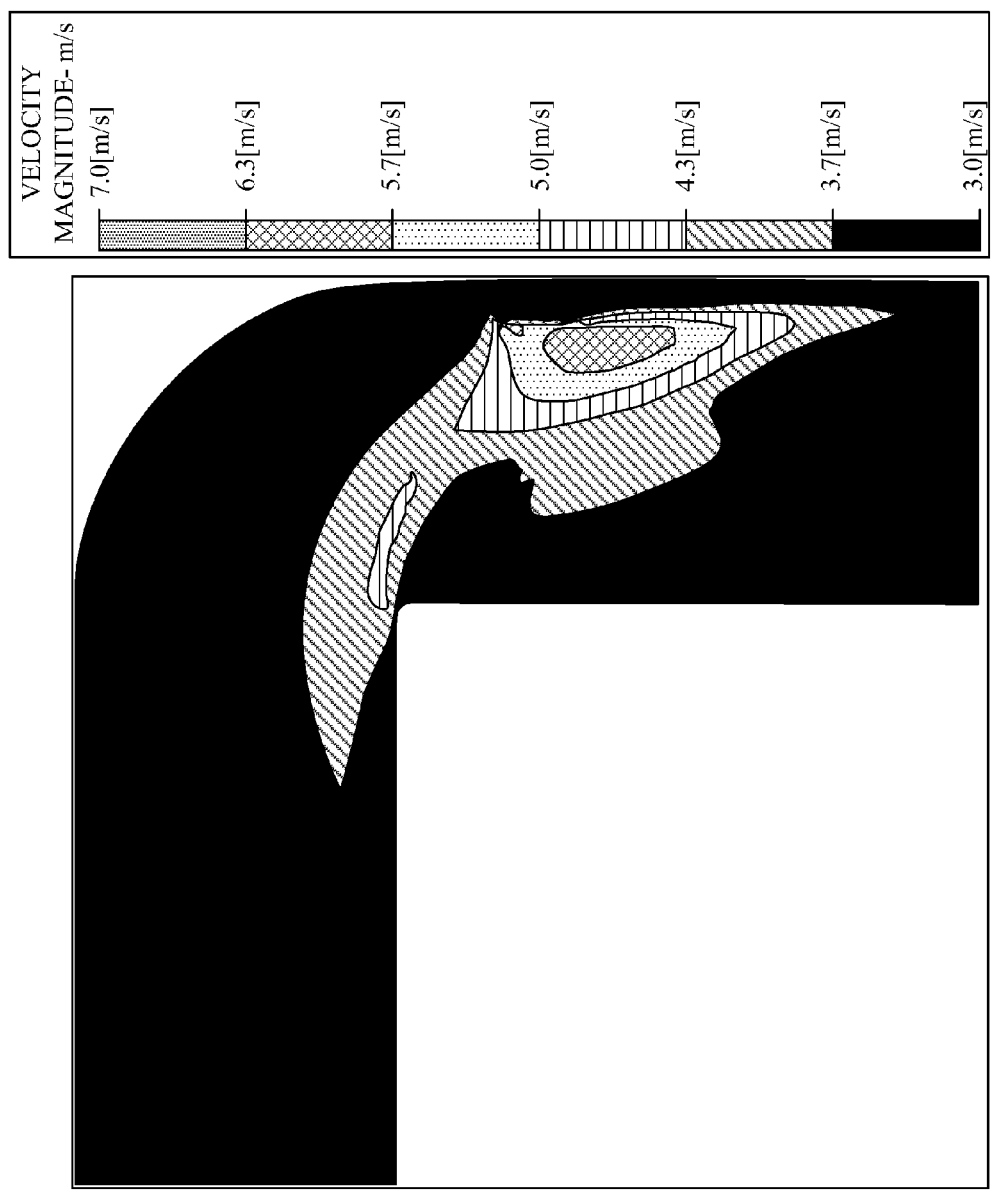
FIG. 8 shows a flow velocity distribution in a cross section of the duct unit not including the flow velocity control structure described in Embodiment 1, along an airflow direction.
Figure 9:
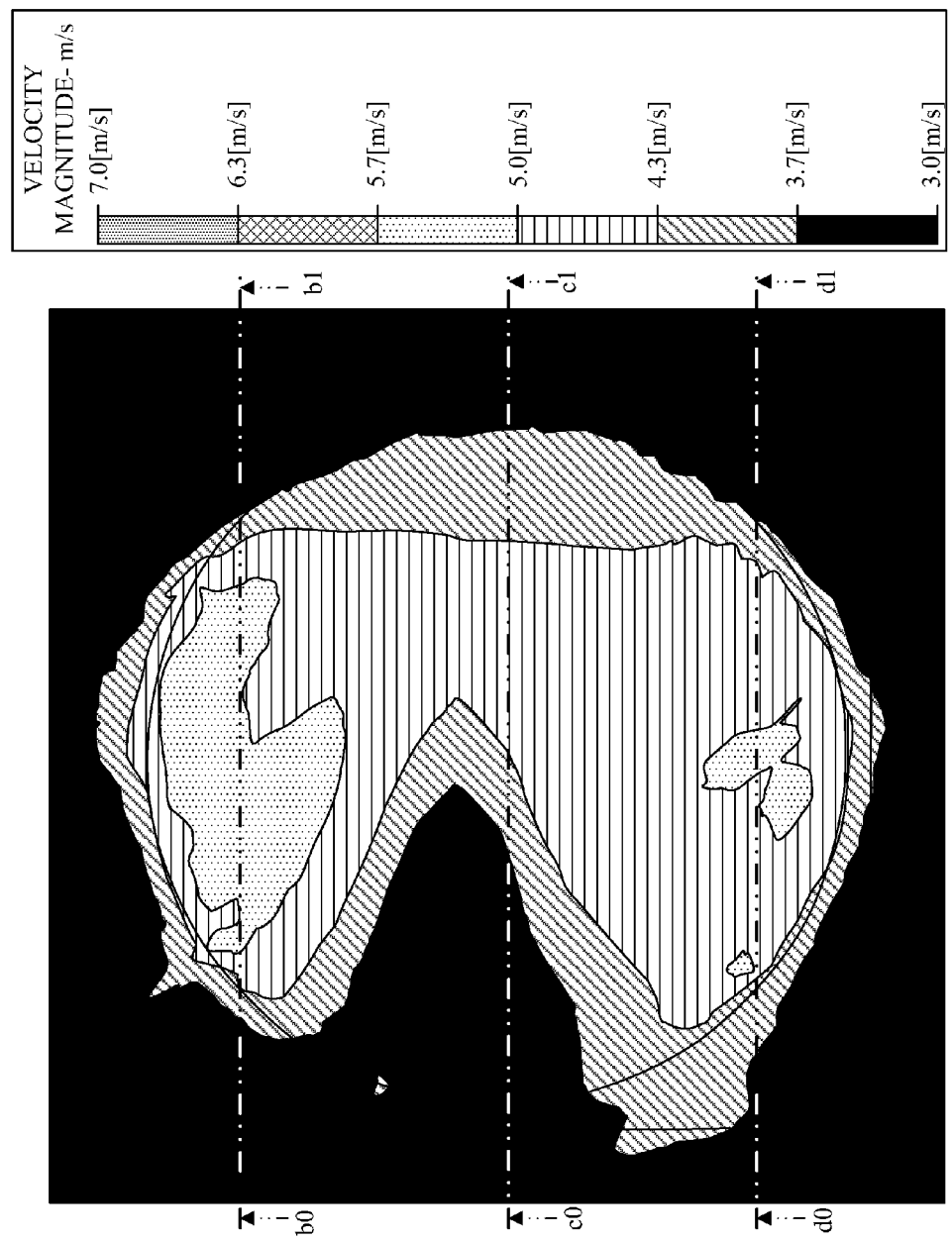
FIG. 9 shows a flow velocity distribution in a cross section of the duct unit not including the flow velocity control structure described in Embodiment 1 along a line a0-a1.
Figure 10:
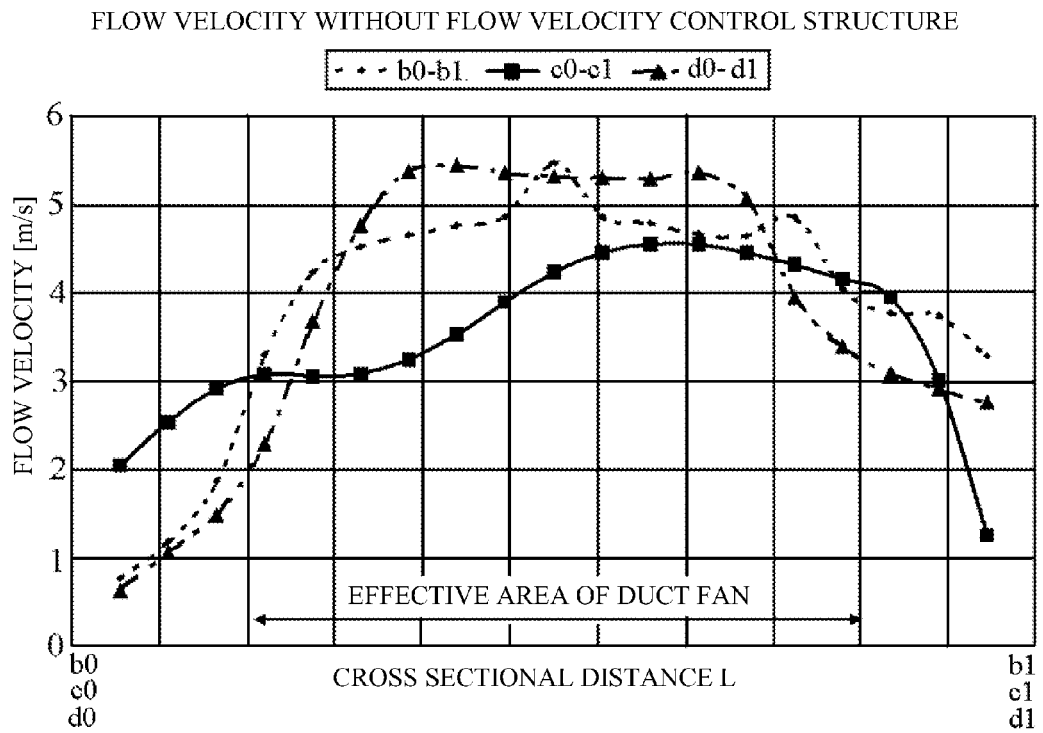
FIG. 10 shows flow velocity in each of cross sections of the duct unit not including the flow velocity control structure described in Embodiment 1 along lines b0-b1, c0-c1 and d0-d1.

FIG. 8 shows a flow velocity distribution of air in the vicinity of a center axis of the fan 4 in a cross section of the duct unit of this comparative example along the air flow direction. FIG. 9 shows a flow velocity distribution of the air immediately before flowing into the fan 4 in a cross section along a line a0-a1 shown in FIG. 7. FIG. 10 shows flow velocity distributions in cross sections along lines b0-b1, c0-c1 and d0-d1 shown in FIG. 9. In FIG. 10, a horizontal axis shows position (cross sectional distance L) in the intersectional-to-flow direction, and a vertical axis shows flow velocity (m/s). The same applies to FIG. 11.

As boundary conditions of this comparative example, pressure at the inlet 2 is set to be 0 (Pa), and flow rate of the air flowing toward the outlet 3 by the rotation of the fan 4 is set to be 1.5 (m³/min).

When the air flows in the bent portion 7 formed with a bend angle of 90 degrees in the duct 1 as shown in FIGS. 8, 9 and 10, a flow velocity of air flowing through an outside part of the bent portion 7 becomes lower (slower) than that of air flowing through an inside part of the bent portion 7 as a result of action of centrifugal force. Therefore, in the air flowing into the fan 4, the air that has flowed through the outside part of the bent portion 7 and the air that has flowed through the inside part of the bent portion 7 have a large flow velocity difference therebetween.

Such flow velocity difference generates airflow separation in the inside part of the bent portion 7, which deteriorates utilization efficiency of the duct 1 (that is, flow path utilization efficiency). Moreover, in the fan 4 rotating its blades to suck in and push out the air, striking of air having a high flow velocity against the blades generates a larger noise as compared with a case of striking of air having a low flow velocity against the blades. Accordingly, the noise generated from the fan 4 increases as the flow velocity difference of the air flowing into the fan 4 increases. Therefore, this embodiment provides the flow velocity control structure 5 on a more upstream side than the fan 4 to reduce such flow velocity difference of the air.

Figure 11:
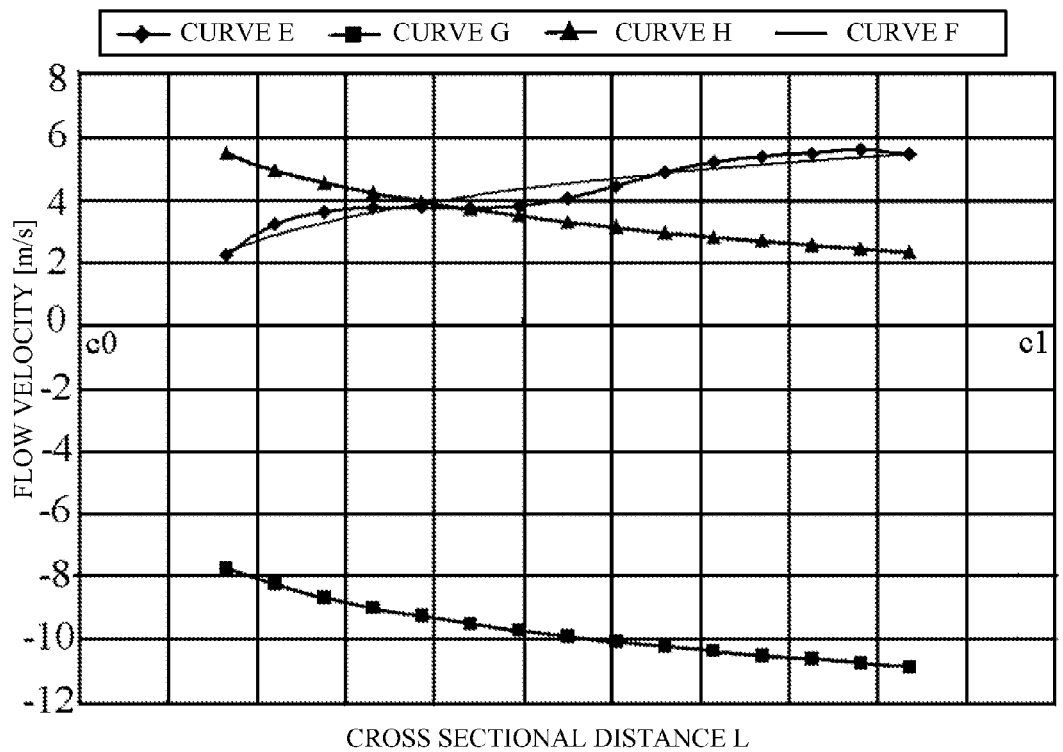
FIG. 11 shows a flow velocity distribution in the cross section of the duct unit not including the flow velocity control structure described in Embodiment 1 along the line c0-c1, an approximation function approximating the flow velocity distribution and an inverse curve of the approximation function.

Next, description will be made of the method to decide the flow velocity control structure 5 in this embodiment, with reference to FIG. 11. A curve E in FIG. 11 shows a flow velocity distribution (that is, a curve that connects flow velocities at respective positions) in the cross section along the line c0-c1 shown in FIG. 9 in the case where the flow velocity control structure 5 is not provided as shown in FIG. 7. One of flow velocity distributions in the cross sections along the lines b0-b1 and d0-d1 may be used as the curve E.

The decision method of the flow velocity control structure 5 first calculates an approximation function (approximation curve) Y=f(X) of the curve E by regression analysis of the curve E. In the approximation function Y=f(X), Y represents flow velocity, and X represents position along the line c0-c1 (that is, in the intersectional-to-flow direction) in the duct 1.

This method defines the approximation function Y=f(X) as a logarithmic function expressed as follows:

$$Y = a1 \times Ln(X) + a2.$$

A curve F in FIG. 11 shows the approximation function of Y=a1×Ln(X)+a2.

Next, the method produces a function Y=f(-X) from the approximation function Y=f(X). The function Y=f(-X) in this embodiment is expressed as follows:

$$Y = a1 \times (-Ln(X)) - a2,$$

and corresponds to a curve G shown in FIG. 11.

Next, in order to match coordinates of Y=f(X) and Y=f(-X) with each other in a Y axis direction, the method calculates the following expression:

$$Y = f(-X) + |Y\max - Y\min|.$$

In the above expression, Ymax and Ymin are a maximum value and a minimum value of the flow velocity Y at positions along the line c0-c1, respectively. The absolute value |Ymax−Ymin| corresponds to a uniformized target flow velocity of the air.

In FIG. 11, a curve H is obtained by calculation of Y=f(−X)+|Ymax−Ymin|. The curve H is a curve (inversion function) obtained by inversing the curve F (approximation function Y=f(X)) on an XY coordinate system.

This embodiment sets the sizes of the flow velocity control members 5a included in the flow velocity control structure 5 so as to provide, to air (fluid) with no flow velocity difference in the intersectional-to-flow direction, flow velocity difference according to the curve H (inversion function). Configuring the flow velocity control structure 5 by alternately arranging the flow velocity control members 5a whose sizes are set as above and the spaces through which the air passes reduces the flow velocity difference of the air shown by the curve F in a counterbalanced manner, which uniformizes the flow velocity of the air in the intersectional-to-flow direction.

Next, description will be made of a method to set the sizes of the flow velocity control members 5a using the curve H (inversion function). In this method, each flow velocity control member 5a has a columnar shape, and the size of the flow velocity control member 5a in this case means a diameter of the columnar shape or an area of the columnar shape when viewed from the airflow direction. The diameter of the columnar shape can be reworded as a width thereof in the intersectional-to-flow direction when viewed from the airflow direction.

Furthermore, in this method, the number of the flow velocity control members 5a is represented by n, the diameter of the columnar shape is represented by Φ, and the diameter Φ of an n-th flow velocity control member 5a counted from an insidemost flow velocity control member 5a in the bent portion 6 is represented by Φn.

Although the flow velocity control structure 5 may be provided at any portion between the inlet 2 and the fan 4 as mentioned above, this embodiment provides it in the bent portion 6.

Firstly, the method decides positions of n columns that are the flow velocity control members 5a such that centers of the n columns are located at an equal interval in a width of the duct 1 in the intersectional-to-flow direction. In this embodiment, six flow velocity control members 5a are disposed.

Next, in order to decide the sizes (diameters) of the respective columns, the method uses the curve H (inversion function). In this method, in the XY coordinate system, the horizontal axis X shows position in the intersectional-to-flow direction in the duct 1, and the position at which the column of the n-th flow velocity control member 5a is disposed is represented by Xn. Moreover, the diameter of the column of the n-th flow velocity control member 5a is represented by ΦTn. In addition, the flow velocity Y at the position Xn is represented by Yn, and the flow velocity Y at which the diameter ΦTn becomes maximum is represented by Yn max. Furthermore, a coefficient to decide the size of each column is represented by (Yn/Yn max). A maximum value of the diameter ΦTn is represented by ΦTn max.

The method calculates the diameter ΦTn of the column of the n-th flow velocity control member 5a by using the above values as follows:

$$\Phi Tn = \Phi Tn\max \times (Yn/Yn\max).$$

As described above, this embodiment sets the different diameters of the columns of the flow velocity control members 5a so as to provide, to the air (fluid) with no flow velocity difference in the intersectional-to-flow direction, flow velocity difference according to the curve H (inversion function). Such setting reduces the flow velocity difference that the air flowing into the flow velocity control structure 5 originally has and is approximated by the curve F (approximation function), which makes it possible to supply air having an approximately uniform flow velocity in the intersectional-to-flow direction to the fan 4. In particular, this embodiment uses, to set the sizes of the flow velocity control members 5a, the approximation function of the flow velocity and the inversion function thereof, which makes it possible to more effectively uniformize the flow velocity.

Figure 2:
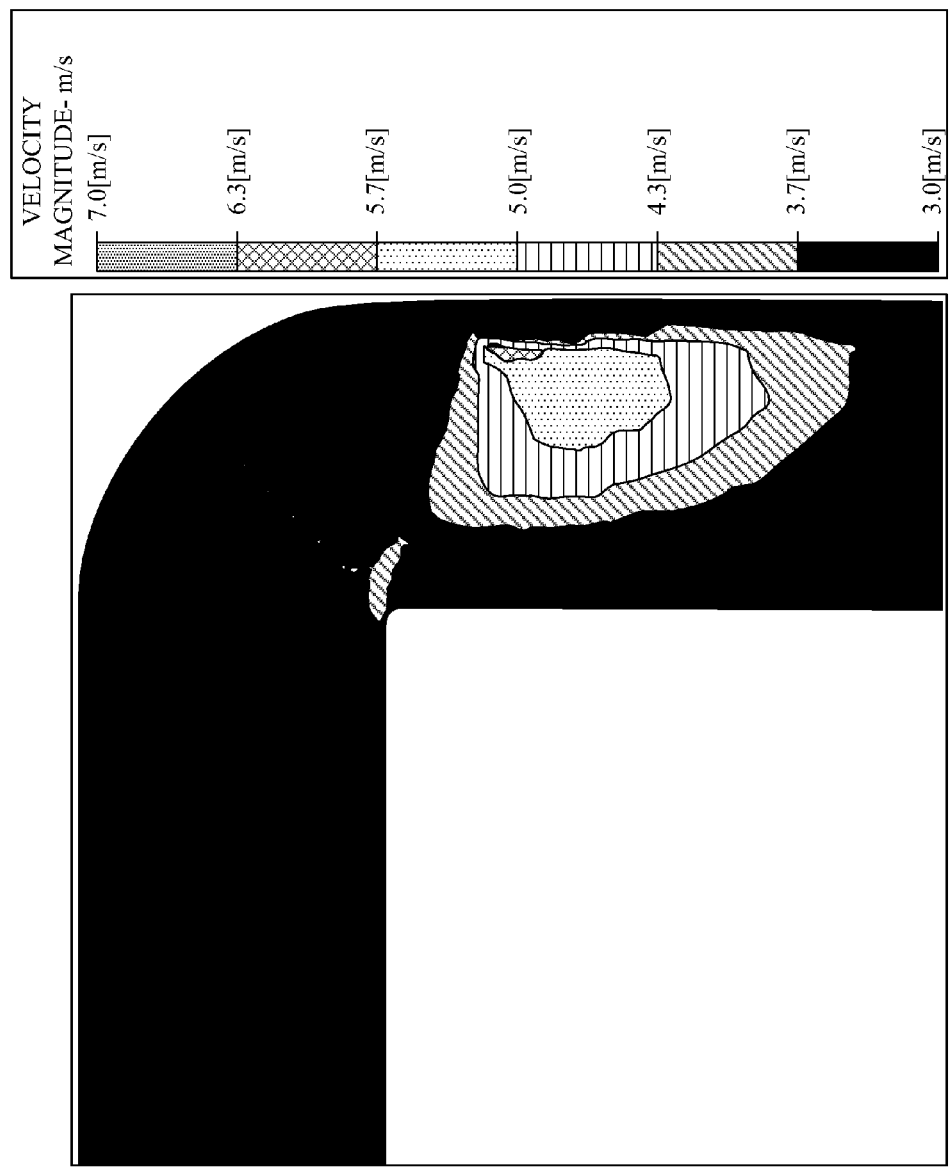
FIG. 2 shows a flow velocity distribution in a cross section of the duct unit of Embodiment 1 along the airflow direction.
Figure 3:
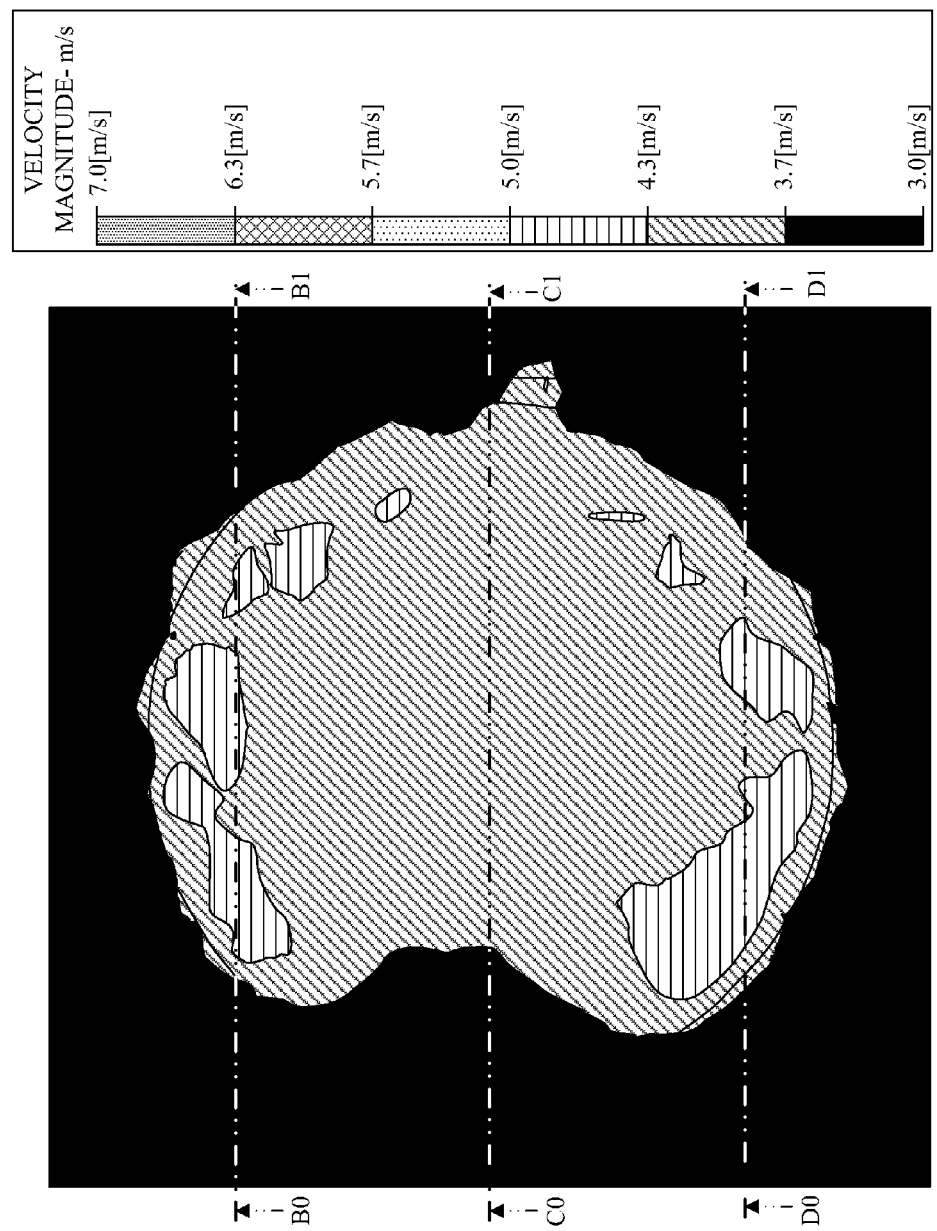
FIG. 3 shows a flow velocity distribution in a cross section of the duct unit of Embodiment 1 along a line A0-A1.
Figure 4:
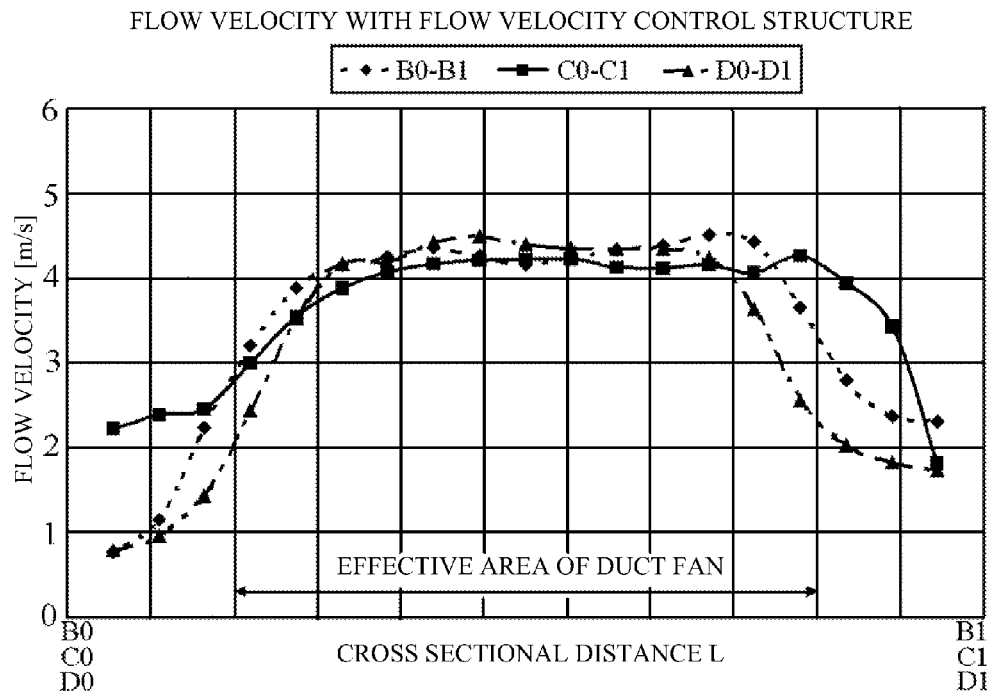
FIG. 4 shows flow velocities in cross sections of the duct unit of Embodiment 1 along lines B0-B1, C0-C1 and D0-D1.

Next, description will be made of effects of the provision of the flow velocity control structure 5 with reference to FIGS. 2 to 6. FIG. 2 shows a flow velocity distribution of air in the vicinity of a center axis of the fan 4 in a cross section of the duct unit of this embodiment along the airflow direction. FIG. 3 shows a flow velocity distribution of the air immediately before flowing into the fan 4 in a cross section along a line A0-A1 shown in FIG. 1. FIG. 4 shows flow velocity distributions in cross sections along lines B0-B1, C0-C1 and D0-D1 shown in FIG. 3. In FIG. 4, a horizontal axis shows position (cross sectional distance L) in the intersectional-to-flow direction, and a vertical axis shows flow velocity (m/s).

As shown in FIGS. 2 to 4, in the intersectional-to-flow direction, the flow velocity difference of the air flowing into the fan 4 in the duct unit of this embodiment is reduced (that is, the flow velocity is uniformized) as compared with the duct unit of the comparative example shown in FIGS. 8 to 10.

The flow velocity control structure 5 (flow velocity control member 5a) provides flow path resistance. However, as described above, no provision of the flow velocity control structure 5 in the duct unit generates the airflow separation in the bent portion 7, which deteriorates the utilization efficiency of the duct 1. Therefore, this embodiment shown in FIG. 1 provides the flow velocity control structure 5 in the duct unit to suppress the generation of the airflow separation in the bent portion 6, thereby enabling improvement of the utilization efficiency of the duct 1. Such an effect makes it possible, even if the flow velocity control structure 5 provides the flow path resistance, to almost equalize the flow path resistance of the entire duct 1 to that in the case of no provision of the low velocity control structure 5.

Figure 5:
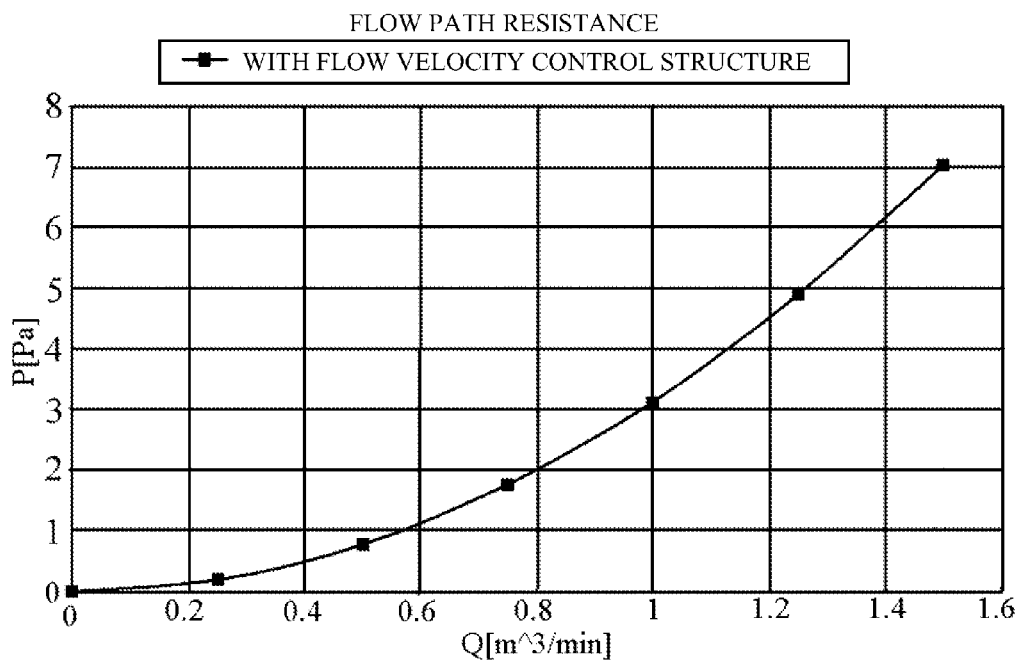
FIG. 5 shows a flow rate-to-pressure correlation of the duct unit of Embodiment 1.
Figure 6:
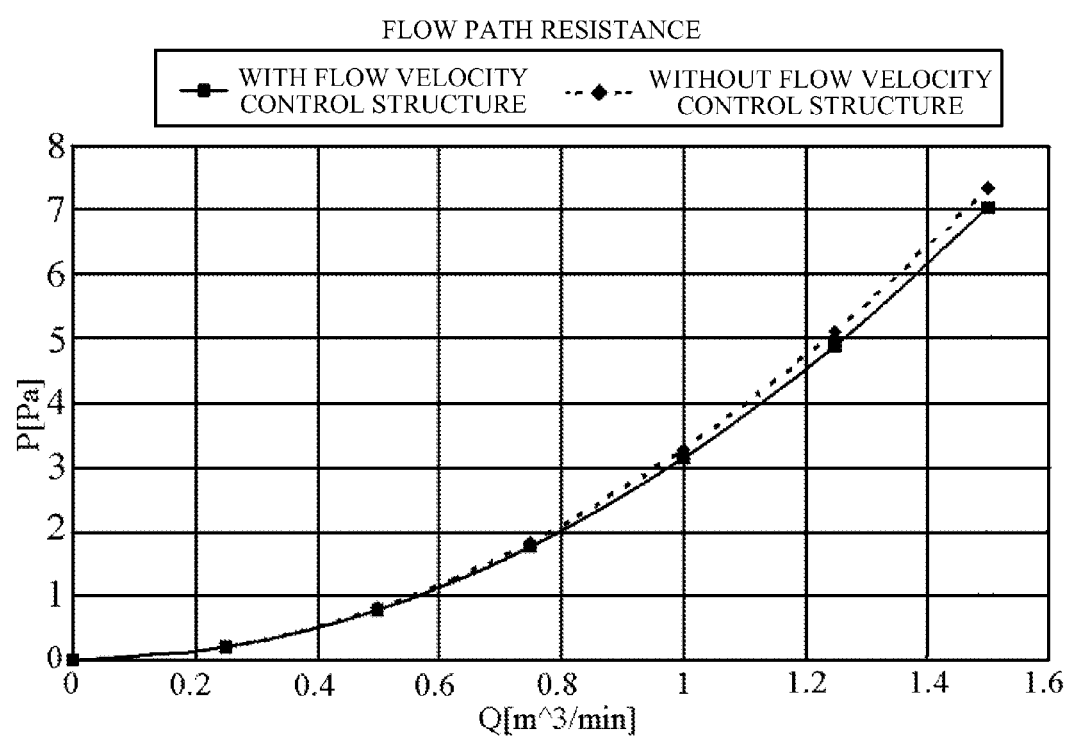
FIG. 6 shows a comparison of the flow rate-to-pressure correlation of the duct unit of Embodiment and that of a duct unit not including the flow velocity control structure described in Embodiment 1.
Figure 12:
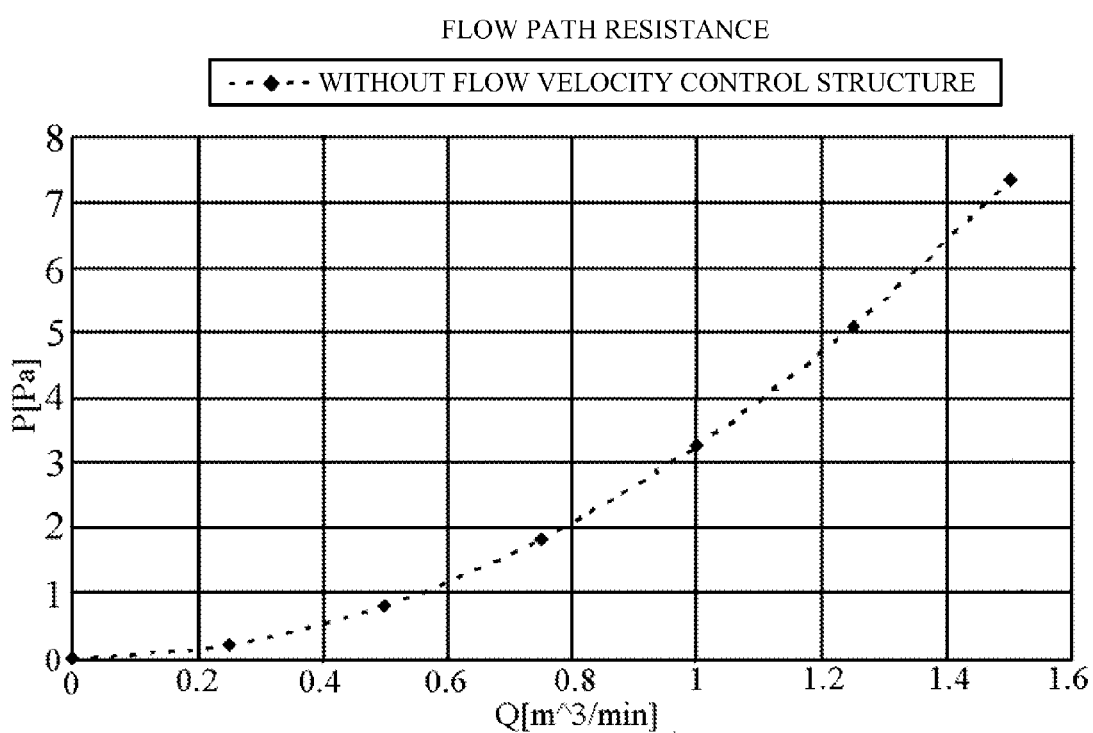
FIG. 12 shows a flow rate-to-pressure correlation of the duct unit not including the flow velocity control structure described in Embodiment 1.

FIG. 5 shows a correlation of airflow rate and air pressure (airflow rate-air pressure correlation) of the duct unit of this embodiment. On the other hand, FIG. 12 shows an airflow rate-air pressure correlation of the duct unit of the comparative example that has no flow velocity control structure 5. FIG. 6 shows a comparison of these flow rate-pressure correlations. In FIGS. 5, 6 and 12, horizontal axes show airflow rate (m³/min), and vertical axes show air pressure (Pa). As shown in FIG. 6, the flow path resistance in this embodiment having the flow velocity control structure 5 is almost equal to that in the comparative example having no flow velocity control structure 5.

This embodiment provides the flow velocity control structure 5 only in a portion where flow velocity control is required between the inlet 2 and the outlet 3, which makes it possible to uniform the flow velocity of the air flowing in with the flow velocity distribution, without complicating the configuration of the duct unit. The uniformed flow velocity enables suppression of the airflow separation in the flow path, which prevents the deterioration of the utilization efficiency of the flow path caused by the airflow separation. Moreover, the uniformed flow velocity enables reduction of required power of the fan 4 and reduction of noise generated from the fan 4.

This embodiment has described the case of forming the flow velocity control member 5a in the columnar shape and sets the diameter that is the size thereof by using the inversion function described above. However, the flow velocity control member 5a may be formed in other shape than the columnar shape, such as a triangular shape, a rectangular shape and a plate-like shape, and a width or an area of the flow velocity control member 5a, which is the size thereof when viewed from the airflow direction, may be set so as to provide flow velocity difference according to the inversion function to air having no flow velocity difference in the intersectional-to-flow direction.

Moreover, this embodiment has described the duct unit controlling the airflow. However, alternative embodiments of the present invention include flow path structures (conduit pipes) controlling flow of liquid such as water and oil, which is fluid, with similar configurations to that of this embodiment.

Embodiment 2

Figure 13:
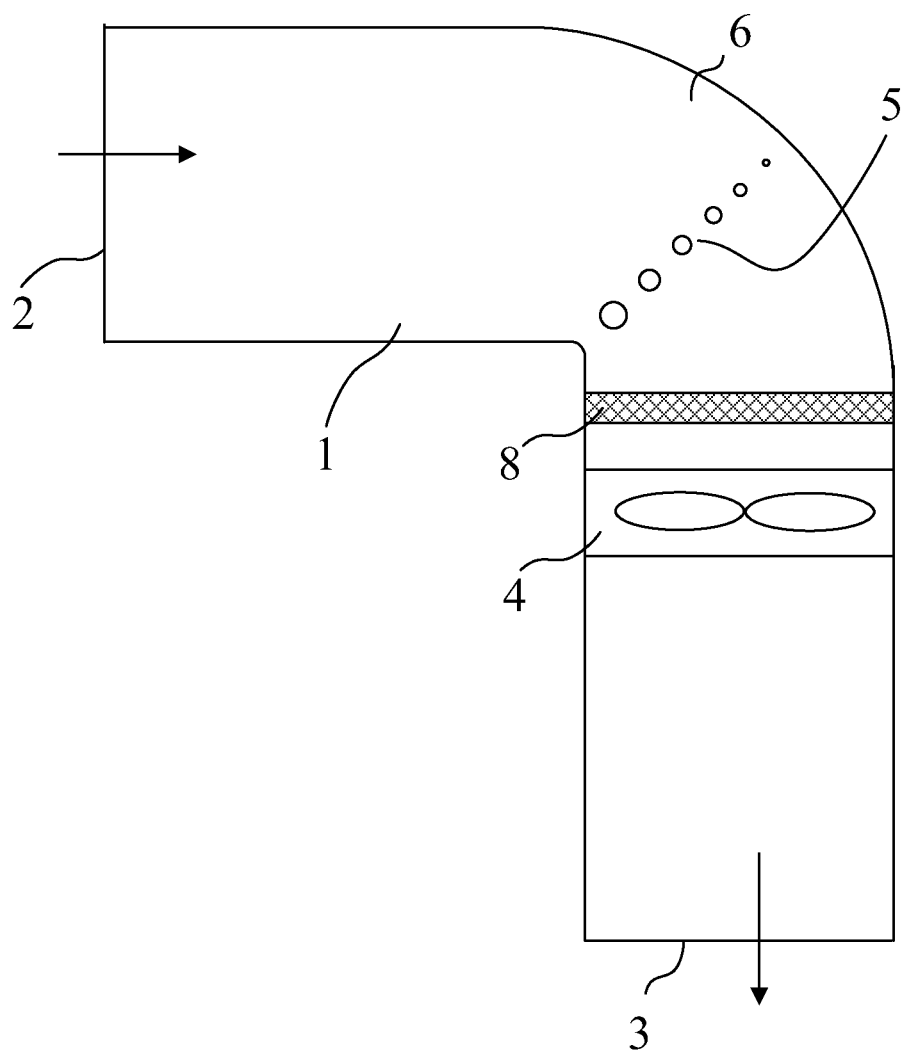
FIG. 13 is a cross-sectional view of a duct unit that is Embodiment 2 of the present invention along an airflow direction.

FIG. 13 shows a cross section of a duct unit that is a second embodiment of the present invention along an airflow direction. Components identical to those in the duct unit of Embodiment 1 are denoted by the same reference numerals as those in Embodiment 1, and description thereof are omitted. Reference numeral demotes a dust collection filter collecting dust contained in air flowing into the duct 1. The dust collection filter 8 is disposed between the flow velocity control structure 5 and the fan 4 (outlet 3).

Collectable dust size and dust collection rate of the dust collection filter 8 are generally changed depending on flow velocity of air passing through the dust collection filter 8. Thus, when flow rate of the air flowing into the duct 1 is constant and a flow velocity distribution of the air exists in an in-plane direction of a dust collection surface of the dust collection filter 8 (that is, in an intersectional-to-flow direction), high flow velocity influences the collectable dust size and the dust collection rate. For example, in a case of using this duct unit in an image projection apparatus such as a liquid crystal projector for introducing cooling air to a liquid crystal panel or an optical element, adhesion of dust onto the liquid crystal panel or the optical element adjacent thereto causes an image of the dust to be included in a projected image, which deteriorates image quality of the projected image.

Moreover, the flow velocity distribution in the in-plane direction of the dust collection surface of the dust collection filter 8 easily causes deposition of the dust and clogging in a filter area where the flow velocity is high, which makes it impossible to efficiently utilize the entire dust collection surface and which requires early replacement of the dust collection filter 8.

Therefore, this embodiment provides, as shown in FIG. 13, the flow velocity control structure 5 on a more upstream side than the dust collection filter 8 (that is, between the inlet 2 and the dust collection filter 8). This configuration enables reduction of the flow velocity difference of the air flowing into the dust collection filter 8 in the in-plane direction of the dust collection surface of the dust collection filter 8, which can improve the dust collection rate of the dust collection filter 8 and can delay the generation of clogging to extend a life of the dust collection filter 8.

Embodiment 3

Figure 14:
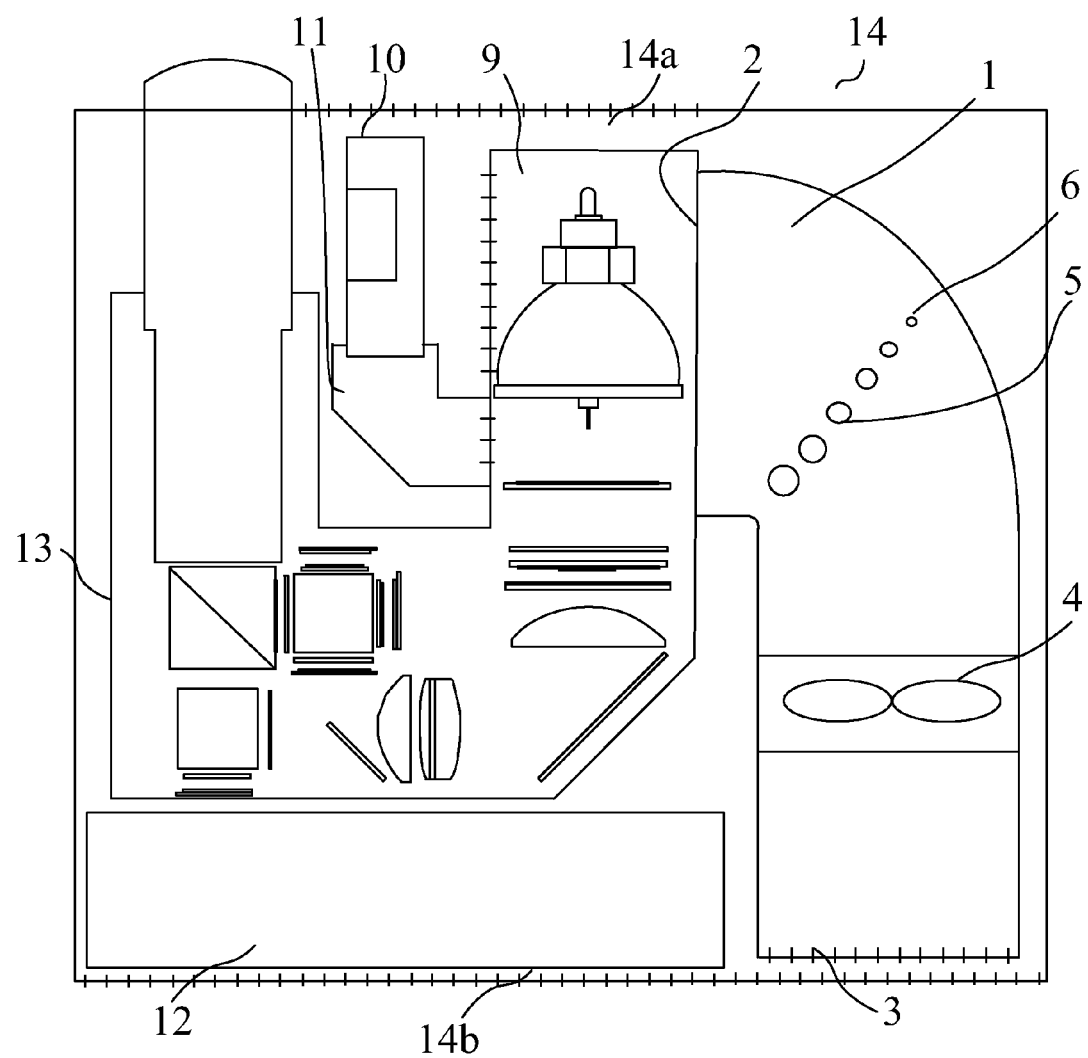
FIG. 14 is a top view of an image projection apparatus that is Embodiment 3 of the present invention.
Figure 15:
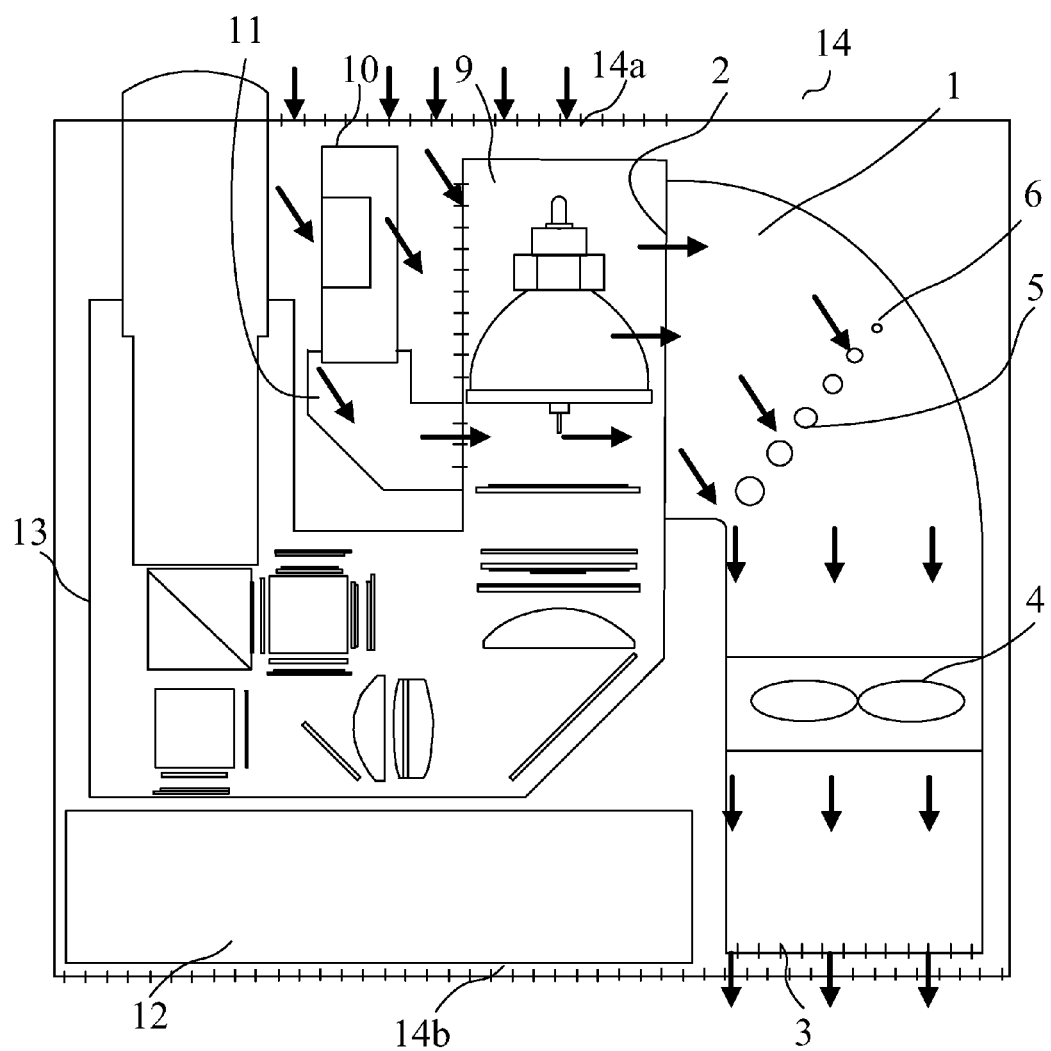
FIG. 15 is a top view showing a cooling structure of the image projection apparatus of Embodiment 3.

FIGS. 14 and 15 show a configuration of an image projection apparatus that is a third embodiment (Embodiment 3) of the present invention, the image projection apparatus including the duct unit described in Embodiment 1. The image projection apparatus of this embodiment is a liquid crystal projector using reflective liquid crystal panels as light modulation elements, and is one of electronic apparatuses or optical apparatuses.

In FIG. 14, reference numeral 9 denotes a light source lamp, and reference numeral 10 denotes a lamp cooling fan for cooling the lamp 9. Reference numeral 11 denotes a lamp cooling duct that introduces air flowing out from the lamp cooling fan 10 toward the lamp 9. Reference numerals 1 to 6 denote the components of the duct unit described bin Embodiment 1, the duct unit being used to cause the air after cooling the lamp 9 to flow out from a chassis of the apparatus through an exhaust outlet 14b described later.

Reference numeral 12 denotes an electronic control unit that controls a power supply unit (not shown) and various operations of the image projection apparatus (liquid crystal projector). Reference numeral 13 denotes an optical engine including an illumination optical system, a color separating/combining optical system and a projection lens. The illumination optical system converts light emitted from the lamp 9 into light appropriate for illumination of the reflective liquid crystal panels. The color separating/combining optical system separates the light from the illumination optical system into plural color lights to introduce them to the reflective liquid crystal panels, and combines the plural color lights modulated by the reflective liquid crystal panels. The projection lens projects the light combined by the color separating/combining optical system onto a projection surface such as a screen. Reference numeral 14 denotes an exterior member that constitutes part of the chassis and includes an external air inlet 14a and the exhaust outlet 14b.

FIG. 15 shows airflow in the image projection apparatus of this embodiment by bold solid arrows. Rotation of the fan 4 and the lamp cooling fan 10 driven with electric power supplied from the electric control unit 12 causes air to flow into the chassis from an outside thereof through the external air inlet 14a. Part of the air flowing into the chassis is sucked in and discharged from the lamp cooling fan 10, cools the lamp 9 and then flows toward the inlet 2 of the duct 1.

The air flowing into the duct 1 from the inlet 2 flows toward the flow velocity control structure 5. The air reaching the flow velocity control structure 5 is uniformized in its flow velocity in the intersectional-to-flow direction by the flow velocity control structure 5, and then flows toward the fan 4. The air flowing into the fan 4 has an approximately uniform flow velocity in the intersectional-to-flow direction, which enables improvement of utilization efficiency of the duct 1 and reduction of noise generated from the fan 4. The air discharged from the fan 4 passes through the outlet 3 and the exhaust outlet 14b to be exhausted to the outside of the chassis.

Although this embodiment has described the case of using the duct unit of Embodiment 1 for the image projection apparatus, the duct unit of Embodiment 1 and the duct unit of Embodiment 2 may be used for various electronic apparatuses (or various optical apparatuses) requiring control of airflow (fluid flow), other than the image projection apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-030431, filed on Feb. 16, 2011, which is hereby incorporated by reference herein in its entirety.

What is claimed is:

1. A flow path structure comprising:
a flow path introducing fluid from an inlet to an outlet; and
when a flow direction of the fluid is a direction that the fluid is guided from the inlet to the outlet, and an intersectional-to-flow direction is a direction intersecting with the flow direction, a flow velocity control structure provided in a portion between the inlet and the outlet in the flow path to reduce difference in flow velocity that the fluid flowing into the flow path has in the intersectional-to-flow direction,
wherein the flow velocity control structure includes, in the intersectional-to-flow direction, plural flow velocity control members provided alternately with spaces through which the fluid passes, and
wherein the flow velocity control members have a first flow velocity control member and a second flow velocity control member, which is provided in a region in which the fluid flows at a higher flow rate than a region provided with the first flow velocity control member,
wherein a width of the second flow velocity control member in the intersectional-to-flow direction at a position of the second flow velocity control member is larger than a width of the first flow velocity control member in the intersectional-to-flow direction at a position of the first flow velocity control member.

2. A flow path structure according to claim 1, wherein, when X represents position in the flow path in the intersectional-to-flow direction, Y represents flow velocity of the fluid at the position X, a distribution of the flow velocity Y in the direction intersecting with the flow direction is approximated by an approximation function of $Y=f(X)$, and a function obtained by inversion of the approximation function in an XY coordinate system is called an inversion function,
the widths of the flow velocity control members at each of the positions where the flow velocity control members are provided, in the intersectional-to-flow direction are set so as to provide, to the fluid having no difference of the flow velocity in the intersectional-to-flow direction, difference in flow velocity according to the inversion function.

3. A flow path structure according to claim 1, wherein the flow velocity control structure is provided inside a bent portion of the flow path.

4. A flow path structure according to claim 1, wherein a fan causing air as the fluid to flow into the flow path is provided between the flow velocity control structure and the outlet.

5. A flow path structure according to claim 1, wherein a dust collection filter is provided between the flow velocity control structure and the outlet.

6. An electronic apparatus comprising:
a heat-generating element;
a flow path structure, the flow path structure including:
a flow path introducing fluid from an inlet to an outlet; and
when a flow direction of the fluid is a direction that the fluid is guided from the inlet to the outlet, and an intersectional-to-flow direction is a direction intersecting with the flow direction, a flow velocity control structure provided in a portion between the inlet and the outlet in the flow path to reduce difference in flow velocity that the fluid flowing into the flow path has in the intersectional-to-flow direction,
wherein the flow velocity control structure includes, in the intersectional-to-flow direction, plural flow velocity control members provided alternately with spaces through which the fluid passes,
wherein the flow velocity control members have a first flow velocity control member and a second flow velocity control member, which is provided in a region in which the fluid flows at a higher flow rate than a region provided with the first flow velocity control member, and
wherein a width of the second flow velocity control member in the intersectional-to-flow direction at a position of the second flow velocity control member is larger than a width of the first flow velocity control member in the intersectional-to-flow direction at a position of the first flow velocity control member.

7. A flow path structure comprising:
a flow path introducing fluid from an inlet through a bent portion to an outlet;
when a flow direction of the fluid is a direction that the fluid is guided from the inlet to the outlet while being bent by the bent portion, and an intersectional-to-flow direction is a direction intersecting with the flow direction, a flow velocity control structure provided inside the bent portion to reduce difference in flow velocity that the fluid has in the intersectional-to-flow direction; and
a fan causing the fluid to flow into the flow path from the inlet and provided between the bent portion and the outlet, wherein the flow velocity control structure includes, in the intersectional-to-flow direction, plural flow velocity control members provided alternately with spaces through which the fluid passes, wherein the flow velocity control members have a first flow velocity control member and a second flow velocity control member, which is provided in a region in which the fluid flows at a higher flow rate than a region provided with the first flow velocity control member, and wherein a width of the second flow velocity control member in the intersectional-to-flow direction at a position of the second flow velocity member is larger than a width of the first flow velocity control member in the intersectional-to-flow direction at position of the first flow velocity control member.

8. An electronic apparatus comprising:

a heat-generating element;

a flow path structure, the flow path structure including:

a flow path introducing fluid from an inlet through a bent portion to an outlet;

when a flow direction of the fluid is a direction that the fluid is guided from the inlet to the outlet while being bent by the bent portion, and an intersectional-to-flow direction is a direction intersecting with the flow direction, a flow velocity control structure provided inside the bent portion to reduce difference in flow velocity that the fluid has in the intersectional-to-flow direction; and a fan causing the fluid to flow into the flow path from the inlet and provided between the bent portion and the outlet, wherein the flow velocity control structure includes, in the intersectional-to-flow direction, plural flow velocity control members provided alternately with spaces through which the fluid passes, wherein the flow velocity control members have a first flow velocity control member and a second flow velocity control member, which is provided in a region in which the fluid flows at a higher flow rate than a region provided with the first flow velocity control member, and wherein a width of the second flow velocity control member in the intersectional-to-flow direction at a position of the second flow velocity member is larger than a width of the first flow velocity control member in the intersectional-to-flow direction at position of the first flow velocity control member.

* * * * *